(12) United States Patent
Moors et al.

(10) Patent No.: US 9,722,105 B2
(45) Date of Patent: Aug. 1, 2017

(54) CONVERSION OF METAL SEED LAYER FOR BUFFER MATERIAL

(71) Applicants: Matthieu Moors, Braine-le-Château (BE); Thomas Pass, San Jose, CA (US)

(72) Inventors: Matthieu Moors, Braine-le-Château (BE); Thomas Pass, San Jose, CA (US)

(73) Assignees: SunPower Corporation, San Jose, CA (US); Total Marketing Services, Puteaux (FR)

(*) Notice: Subject to any disclaimer, the term of this patent is extended or adjusted under 35 U.S.C. 154(b) by 358 days.

(21) Appl. No.: 14/229,473

(22) Filed: Mar. 28, 2014

(65) Prior Publication Data

US 2015/0280027 A1    Oct. 1, 2015

(51) Int. Cl.
*H01L 31/0224*    (2006.01)

(52) U.S. Cl.
CPC ...... *H01L 31/022441* (2013.01); *Y02E 10/50* (2013.01)

(58) Field of Classification Search
CPC .............. H01L 31/047; H01L 31/0475; H01L 31/0504; Y02E 10/50; Y02P 70/521
See application file for complete search history.

(56) References Cited

U.S. PATENT DOCUMENTS

| | | | |
|---|---|---|---|
| 4,915,759 A * | 4/1990 | Moran | H05K 3/38 156/89.15 |
| 2008/0044964 A1 | 2/2008 | Kamath et al. | |
| 2012/0060908 A1 * | 3/2012 | Crafts | H01L 31/022425 136/255 |
| 2012/0060911 A1 | 3/2012 | Fu et al. | |
| 2012/0142140 A1 | 6/2012 | Li et al. | |
| 2013/0093288 A1 * | 4/2013 | Fox | C30B 23/02 310/348 |
| 2016/0064592 A1 * | 3/2016 | Cui | H01L 31/02167 136/256 |

OTHER PUBLICATIONS

International Search Report and Written Opinion from PCT/US2015/02235 mailed Jun. 4, 2015, 12 pgs.
J. Park et al., "Localized anodization of aluminum for the formation of Aluminum/Alumina patterns", *Asian Symposium for Precision Engineering & Nanotechnology*, 2009.
D. A. Brevnov et al., "Fabrication of Patterned Arrays with Alternating Regions of Aluminum and Porous Aluminum Oxide", ectrochem, *Solid-State Lett*. 2005 vol. 8, Issue 1, C4-C5.
H. Jha et al., "Micro-patterning in anodic oxide film on aluminium by laser irradiation", *Electrochimica Acta 52*, 2007, 4724-4733.
International Preliminary Report on Patentability for PCT Patent Application No. PCT/US2015/02235 mailed Oct. 13, 2016, 9 pgs.

* cited by examiner

*Primary Examiner* — Michelle Mandala
(74) *Attorney, Agent, or Firm* — Blakely Sokoloff Taylor Zafman LLP

(57) ABSTRACT

Approaches for forming solar cells with a converted seed layer as a buffer material and the resulting solar cells are described. In an example, a method of fabricating a solar cell includes converting regions of a seed layer disposed on a plurality of p-n junctions of the solar cell to form a pattern of interdigitated converted regions. The converted regions are configured to electrically insulate non-converted regions of the seed layer from each other and provide a barrier to a laser that is, in fabricating the solar cell, directed towards the seed layer such that the barrier substantially avoids degradation of at least the plurality of p-n junctions from the laser.

20 Claims, 11 Drawing Sheets

CONVERSION OF METAL SEED LAYER FOR BUFFER MATERIAL

TECHNICAL FIELD

Embodiments of the present disclosure are in the field of renewable energy and, in particular, include solar cells and methods of fabricating solar cells with a converted seed layer for a buffer material.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Techniques for increasing the efficiency in the manufacture of solar cells are generally desirable. Some embodiments of the present disclosure allow for increased solar cell manufacturing efficiency by providing novel processes for fabricating solar cell structures.

DETAILED DESCRIPTION

Figure 1A:
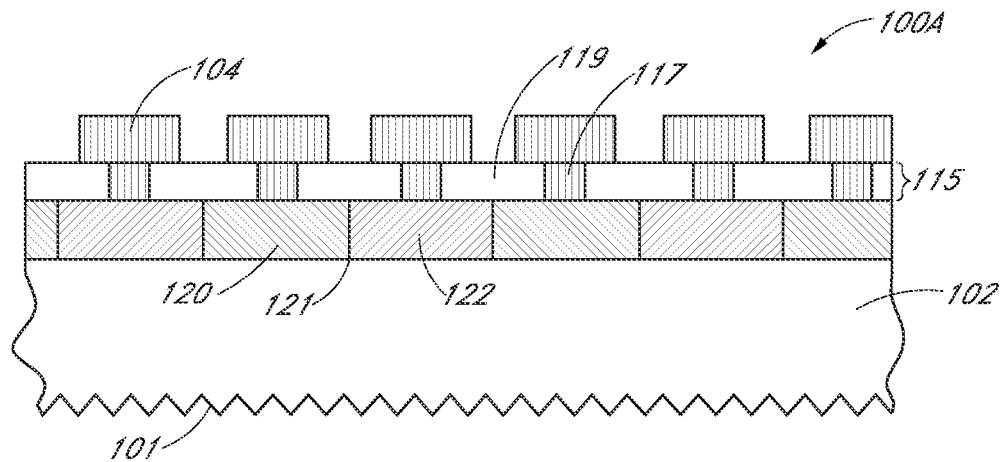
FIGS. 1A and 1B illustrate cross-sectional views of a portion of a solar cell with conductive contacts including converted seed layer regions as a buffer material, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled." The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Approaches for forming solar cells with a converted seed layer as a buffer material and the resulting solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as copper plating techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In an embodiment, a method of fabricating a solar cell involves forming a metal seed layer over a substrate including p-n junctions. The method involves converting regions of the metal seed layer over the p-n junctions to a metal oxide, and forming conductive contacts for the solar cell from unconverted regions of the metal seed layer.

In another embodiment, a method of fabricating a solar cell, involves converting regions of a seed layer disposed on a plurality of p-n junctions of the solar cell to form a pattern of interdigitated converted regions. The converted regions are configured to electrically insulate non-converted regions of the seed layer from each other and provide a barrier to a laser that is, in fabricating the solar cell, directed towards the seed layer such that the barrier substantially avoids degradation of at least the plurality of p-n junctions from the laser.

Also disclosed herein are solar cells. In an embodiment, the solar cell includes a substrate having p-n junctions. A metal seed layer is disposed over the substrate. The metal seed layer includes oxidized regions disposed over the p-n junctions that extend through the thickness of the metal seed layer. The solar cell also includes conductive contacts disposed over metal regions between the oxidized regions of the metal seed layer.

In another embodiment, a solar cell includes a substrate including p-n junctions. A first layer disposed over the substrate that includes metal fingers electrically isolated by metal oxide fingers. The solar cell also includes conductive contacts disposed over the metal fingers of the first layer.

Thus, embodiments of the present disclosure include solar cells with a buffer material formed from converted regions of a metal seed layer, and methods of fabricating such solar cells.

Figure 1B:
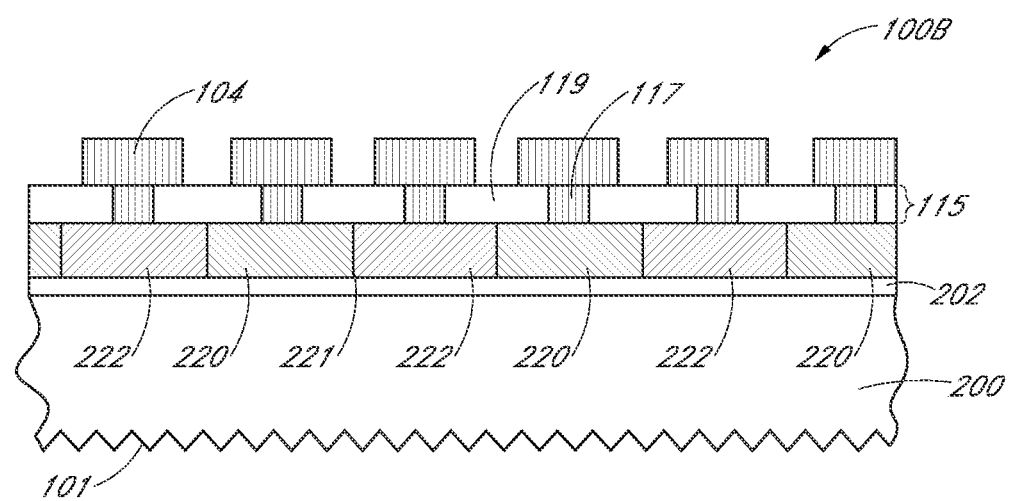

FIGS. 1A and 1B illustrate cross-sectional views of solar cells in accordance with embodiments of the present disclosure.

Referring to FIG. 1A, a portion of a solar cell 100A includes a plurality of n-type doped diffusion regions 120 and a plurality of p-type doped diffusion regions 122 in a substrate 102, such as a bulk crystalline (e.g., monocrystalline) silicon substrate. The n-type doped diffusion regions 120 and p-type doped diffusion regions 122 form p-n junctions 121.

In an embodiment, the diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for the solar cell 100A. Thus, in an embodiment, the conductive contacts 104 are disposed on the emitter regions. In an embodiment, the conductive contacts 104 are back contacts for a back-contact solar cell and are situated on a surface of the solar cell opposing a light receiving surface, such as opposing a texturized light receiving surface 101.

The solar cell 100A further includes a seed layer 115 disposed above the plurality of n-type and p-type doped diffusion regions 120 and 122. According to embodiments, the seed layer 115 has regions (e.g., "fingers") that have been converted to an electrically isolating material. For example, according to one embodiment, the metal seed layer 115 has oxidized regions 119 disposed over the p-n junctions 121. The oxidized regions extend through the thickness of the metal seed layer 115, electrically isolating the metal regions 117. Conductive contacts 104 are disposed over the metal regions 117 of the seed layer 115 and are coupled to the plurality of n-type doped diffusion regions 120 and to the plurality of p-type doped diffusion regions 122. In another example, the layer 115 may include metal fingers electrically isolated by metal oxide fingers. In one such embodiment, the conductive contacts 104 are disposed over the metal fingers. Thus, according to embodiments, instead of etching the metal seed layer 115 to electrically isolate conductive regions 117, embodiments involve converting regions 119 to a different material to electrically isolate the conductive regions 117.

In one embodiment, the seed layer 115 includes an aluminum layer that has regions that are converted into another material, such as aluminum oxide. Thus, in one such embodiment, the seed layer 115 includes aluminum regions 117 between aluminum oxide regions 119. In an embodiment including interdigitated fingers, the metal fingers are aluminum, and the electrically isolating fingers are aluminum oxide. In other embodiments, the seed layer 115 may include different and/or additional materials. For example, the seed layer 115 may include one or more of titanium, copper, nickel, or another metal that may be converted to a metal oxide or other electrically isolating material.

In addition to electrically isolating the conductive regions 117, and therefore the conductive contacts 104, the converted regions 119 may also provide a damage buffer to protect underlying layers during fabrication. For example, as is described in more detail below with respect to FIGS. 9A-9C, the converted regions 119 may provide a damage buffer for processes involving laser patterning. A damage buffer may protect underlying layers from degradation of mechanical and/or optical properties. Existing methods of protecting a substrate from laser processing typically involve putting down special damage barriers. Such additive processes may increase costs and material usage. In contrast, the converted regions 119 of the seed layer 115 provide both electrical isolation for the conductive contacts 104, as well as a damage buffer, according to embodiments. According to embodiments, the metal seed layer has a thickness in a range of 0.3 to 2 μm. The acceptable range of thicknesses of the seed layer may be determined according to, for example, the ability of the seed layer to provide a damage buffer and/or the ability to convert regions of the seed layer to provide electrical insulation.

FIG. 1B illustrates a cross-sectional view of a portion of a solar cell having conductive contacts formed on emitter regions formed above a substrate, in accordance with an embodiment of the present disclosure. Referring to FIG. 1B, a portion of a solar cell 100B includes a seed layer 115 disposed above a plurality of n-type doped polycrystalline silicon (polysilicon) regions 220 and a plurality of p-type doped polysilicon regions 222. As illustrated, p-n junctions 221 are formed where the n-type doped polysilicon regions 220 and p-type doped polysilicon regions 222 meet. In other embodiments, a trench is formed partially into the substrate 200, and the seed layer 115 is conformal to the trenched structure. The seed layer 115 of FIG. 1B may be similar to, or the same as, the seed layer 115 described with respect to FIG. 1A. Although described as polycrystalline silicon regions 220 and 222, in an alternative embodiment, the regions 220 and 222 are formed from an amorphous silicon layer.

In the illustrated embodiment, conductive contacts 104 are formed from conductive metal regions 117 of the seed layer and are coupled to the plurality of n-type doped polysilicon regions 220 and to the plurality of p-type doped polysilicon regions 222. The plurality of n-type doped polysilicon regions 220 and the plurality of p-type doped polysilicon regions 222 can, in one embodiment, provide emitter regions for the solar cell 100B. Thus, in an embodiment, the conductive contacts 104 are disposed on the emitter regions. In an embodiment, the conductive contacts 104 are back contacts for a back-contact solar cell and are situated on a surface of the solar cell opposing a light receiving surface 101 of the solar cell 100B. Furthermore, in one embodiment, the emitter regions are formed on a thin or tunnel dielectric layer 202. In one embodiment in which the emitter regions are formed from an amorphous silicon layer, the amorphous silicon emitters are disposed on an intrinsic amorphous silicon layer.

Although certain materials are described specifically above with reference to FIGS. 1A and 1B, some materials may be readily substituted with others, with other such embodiments remaining within the spirit and scope of embodiments of the present disclosure. For example, in an embodiment, a different material substrate, such as a group III-V material substrate, can be used instead of a silicon substrate.

As explained above, FIGS. 1A and 1B illustrate portions of solar cells with conductive contacts including converted seed layer regions as a buffer material, according to embodiments of the disclosure. Exemplary fabrication processes for forming solar cells such as the solar cells illustrated in FIGS. 1A and 1B are described below with reference to FIGS. 2A-2C.

Figure 2A:
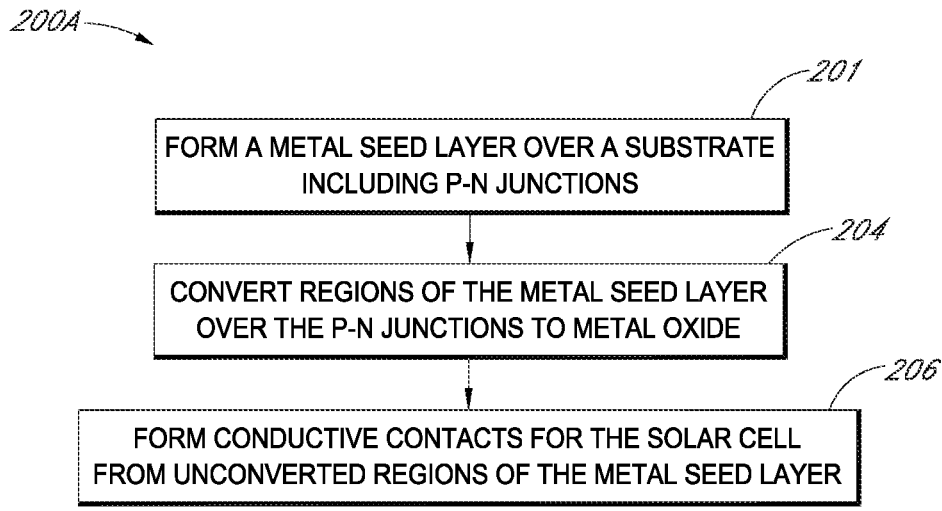
FIGS. 2A, 2B, and 2C are flowcharts illustrating operations in methods of fabricating a solar cell, in accordance with embodiments of the present disclosure.
Figure 2B:
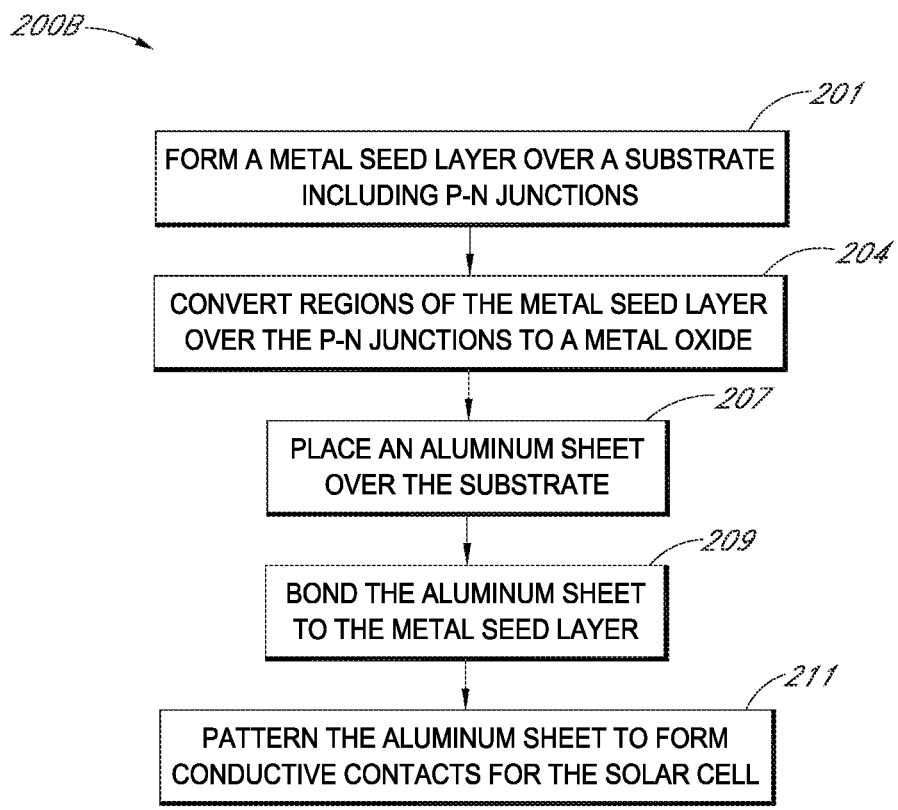
Figure 2C:
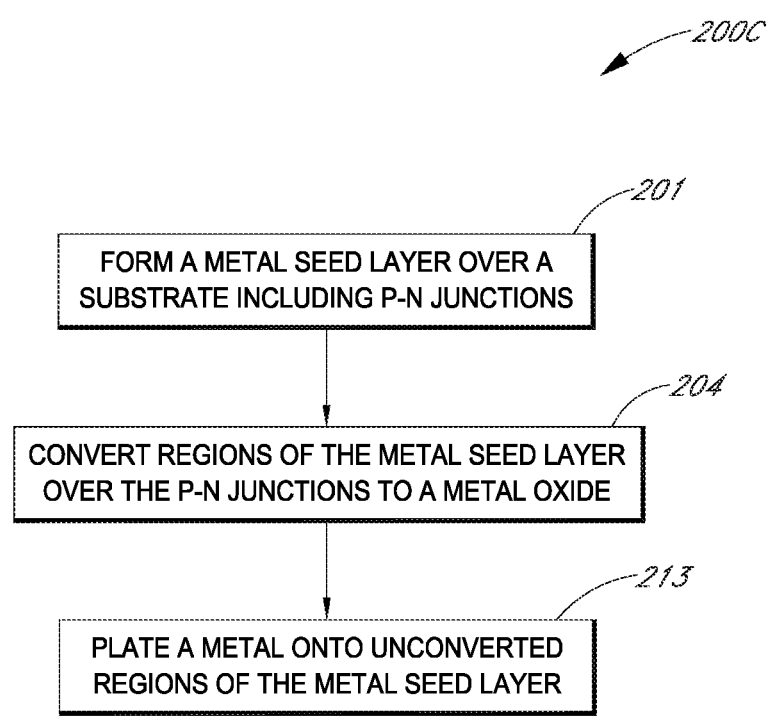

FIGS. 2A, 2B, and 2C are flowcharts illustrating operations in methods of fabricating a solar cell, in accordance with embodiments of the present disclosure.

Figure 3A:
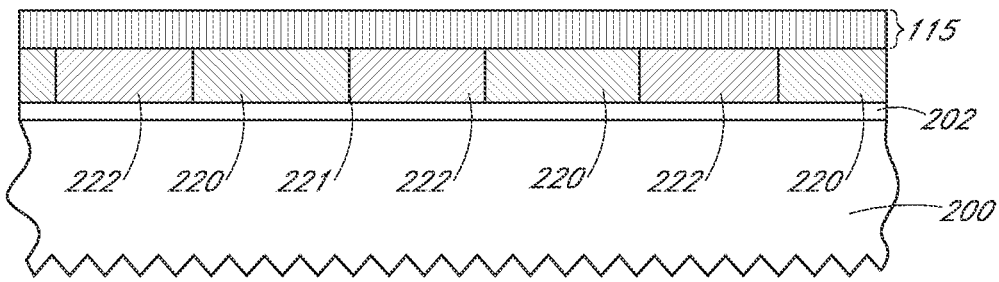
FIGS. 3A-3C illustrate cross-sectional views of processing operations in a method of fabricating solar cells corresponding to operations of the flowchart of FIG. 2A, in accordance with an embodiment of the present disclosure.

The methods 200A of FIG. 2A, 200B of FIG. 2B, and 200C of FIG. 2C involve forming a metal seed layer over a substrate including p-n junctions, at operation 201. FIG. 3A illustrates an example of a metal seed layer 115 formed over a substrate. Forming the metal seed layer 115 may include, for example, blanket depositing a metal (e.g., aluminum) over the substrate. Deposition of the metal seed layer 115 may involve, for example, chemical vapor deposition (CVD), physical vapor deposition (PVD), or any other deposition method capable of forming a metal seed layer over the substrate.

Figure 3B:
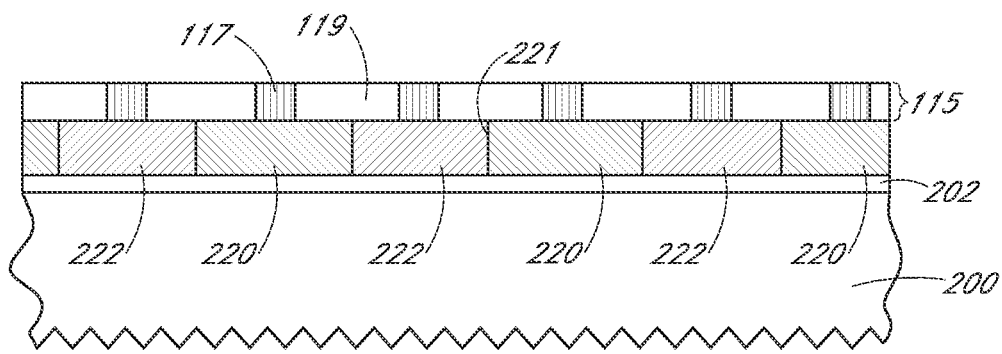

At operation 204, the methods 200A, 200B, and 200C involve converting regions of the metal seed layer 115 over the p-n junctions 221 to a metal oxide. For example, as illustrated in FIG. 3B, the methods involve converting regions 119 of the seed layer 115 to a metal oxide. In between the converted regions 119 are metal regions 117. In an embodiment where the seed layer is aluminum, converting the regions 119 of the metal seed layer 115 may involve converting the regions 119 to aluminum oxide. FIGS. 4A, 4B, 5A-5C, 6A, 6B, 7A-7C, 8A-8C illustrate examples of methods for converting regions of the seed layer, in accordance with embodiments of the present disclosure. Other embodiments may involve converting regions 119 of the metal seed layer 115 to another material, such as a metal nitride, a metal oxynitride, or other material capable of providing sufficient electrical isolation.

In a solar cell with conductive "fingers," converting regions of the seed layer disposed on a plurality of p-n junctions of the solar cell involves forming a pattern of interdigitated converted regions. The converted regions are configured to electrically insulate non-converted regions of the seed layer from each other. Thus, according to embodiments, the thickness of the metal seed layer depends upon the ability to convert the region completely through to the underlying layers to provide electrical insulation of the conductive contacts from each other. As will be described in more detail below, the converted regions may also provide a barrier to a laser that is, in fabricating the solar cell, directed towards the seed layer such that the barrier substantially avoids degradation of at least the plurality of p-n junctions from the laser. Therefore, in one such embodiment, the thickness of the metal seed layer may also depend upon the properties of the laser used in the fabrication process. For example, a fabrication process employing extensive and/or high intensity laser patterning, the metal seed layer may be made thick to provide a sufficient damage barrier. An insufficiently thick damage barrier may result in inefficient or defective solar cells. For a fabrication process involving minimal or no laser processing, the metal seed layer may be made thinner to, for example, to reduce the amount of seed material used and/or reduce the time and costs associated with converting regions of the metal seed layer.

Figure 4A:
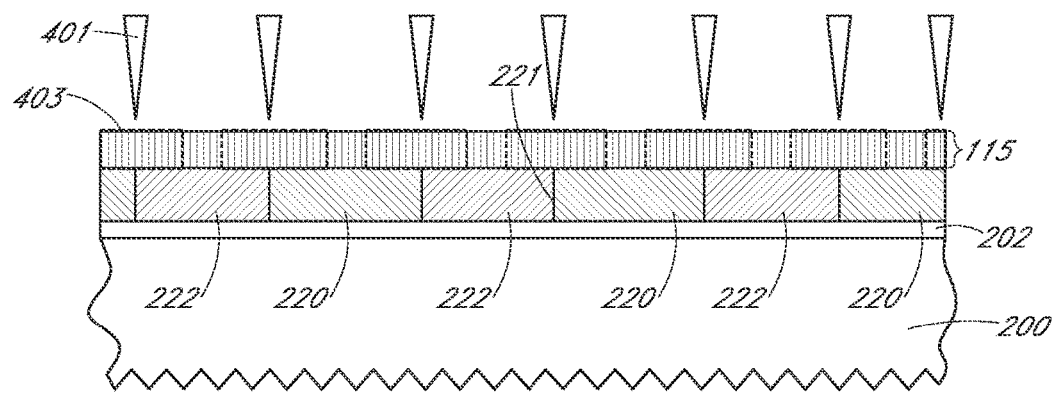
FIGS. 4A and 4B illustrate cross-sectional views of processing operations in a method corresponding to operation 204 of the flowchart of FIG. 2A, in accordance with an embodiment of the present disclosure.
Figure 4B:
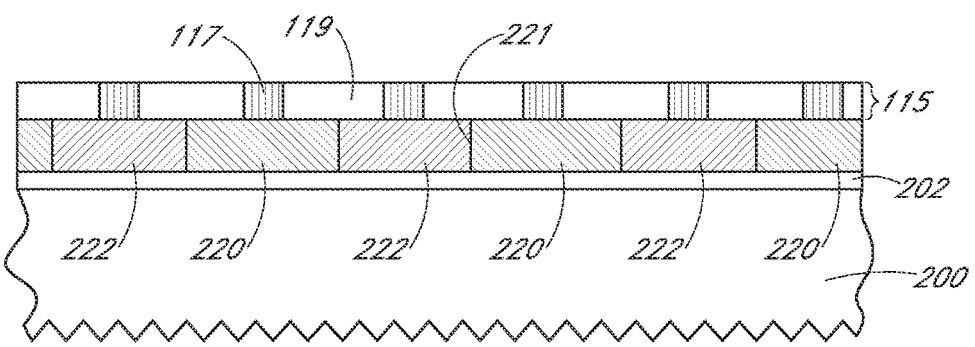

Turning to exemplary methods of converting regions of the seed layer, FIGS. 4A and 4B illustrate a method of converting regions of the seed layer with laser radiation in ambient atmosphere having oxygen, in accordance with an embodiment. For example, FIG. 4A illustrates regions 403 (indicated by the dotted lines) of the metal seed layer 115 over p-n junctions 221 of the substrate that are to be converted to a metal oxide. In the illustrated embodiment, converting the regions 403 involves direct writing the regions 403 with a laser in an atmosphere with oxygen. The laser radiation 401 impinges upon the seed layer 115 in the regions 403 to be converted, resulting in formation of metal oxide regions 119. The metal oxide formation is driven down to the p-n junction (e.g., through the entire seed layer 115) to prevent electrical contact between the surrounding metal regions 117. Thus, embodiments involving direct writing with a laser in an oxygen-containing atmosphere may be employed to pattern (e.g., convert) regions of the seed layer 115 without requiring the use of a mask. For example, embodiments may involve direct writing with a UV, green, or infrared laser in an oxygen-containing atmosphere to convert regions of the seed layer 115 to a metal oxide.

Figure 5A:
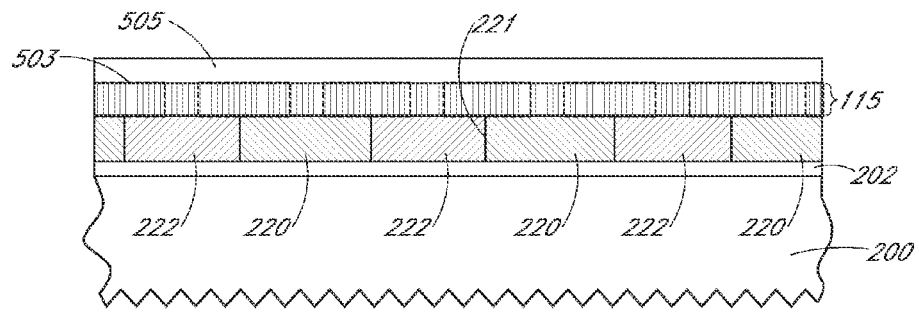
FIGS. 5A-5C illustrate cross-sectional views of processing operations in a method corresponding to operation 204 of the flowchart of FIG. 2A, in accordance with an embodiment of the present disclosure.
Figure 5B:
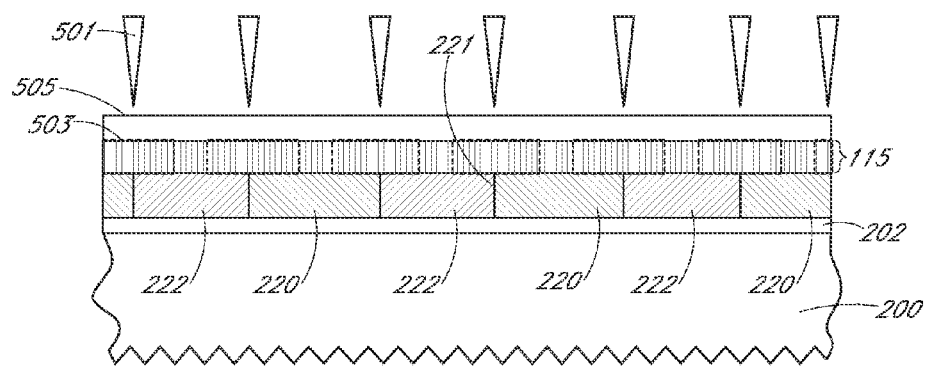
Figure 5C:
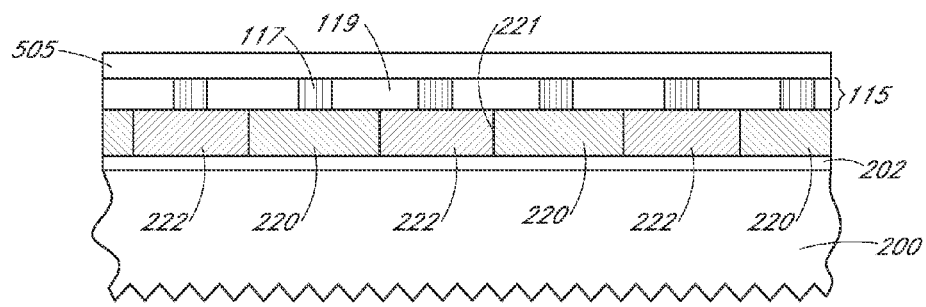

FIGS. 5A-5C illustrate a method of converting regions of the seed layer with laser radiation and an oxidizing coating, in accordance with an embodiment. Similar to the method illustrated in FIGS. 4A and 4B, the method of FIGS. 5A-5C involves direct writing regions 503 of the metal seed layer 115 to be converted with a laser. However, rather than using the oxygen in the ambient environment to form the metal oxide regions, an oxidizing coating or film 505 is applied to the metal seed layer 115, as illustrated in FIG. 5A. The oxidizing coating 505 may be formed by, for example, spin-coating, or other methods of forming an oxidizing coating or film. The oxidizing coating is formed from a material that converts the underlying metal regions to a metal oxide when exposed to laser radiation.

The exemplary method then involves direct writing the coating in the regions 503 to be converted. The laser 501 impinges upon the oxidizing coating 505 above the regions 503 to be converted. The oxidizing coating 505 and laser radiation result in formation of the metal oxide regions 119 between metal regions 117. Due to the use of a laser to direct write the pattern, the method of FIGS. 5A-5C also does not require a mask. However, in comparison to the method of direct writing with a laser in an ambient atmosphere with oxygen, the method involves additional processing to coat the metal seed layer 115 with the oxidizing coating 505. The oxidizing coating 505 may then be removed prior to forming conductive contacts from the metal regions 117.

Figure 6A:
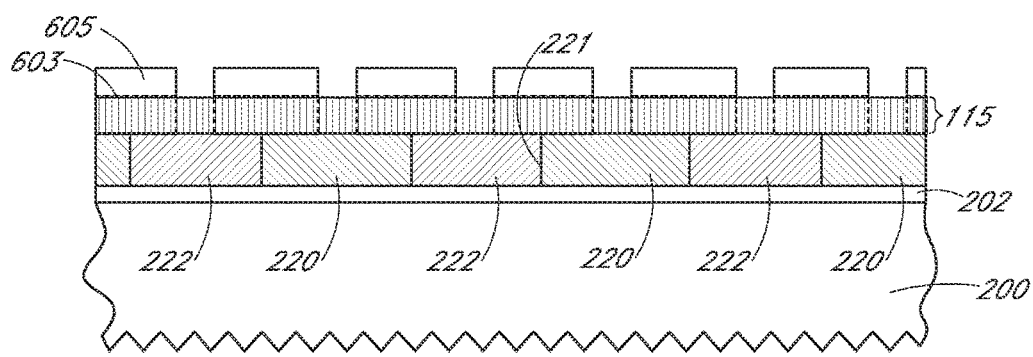
FIGS. 6A and 6B illustrate cross-sectional views of processing operations in a method corresponding to operation 204 of the flowchart of FIG. 2A, in accordance with an embodiment of the present disclosure.
Figure 6B:
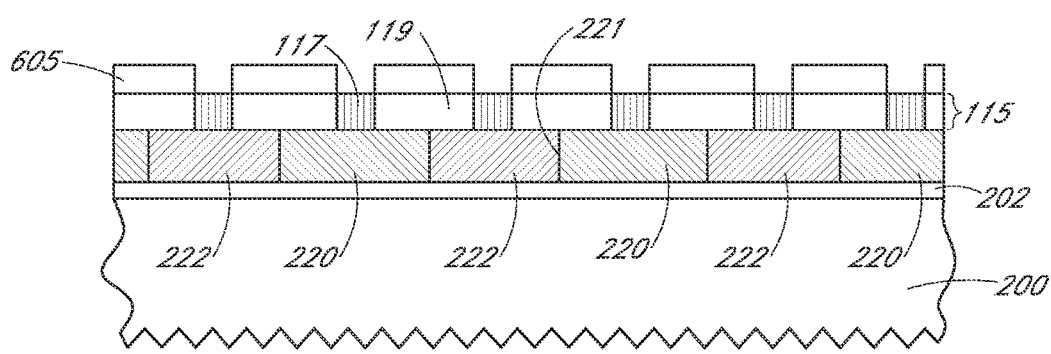

FIGS. 6A and 6B illustrate a method of converting regions of the seed layer with a mask formed with an oxidizing paste, in accordance with an embodiment. As illustrated in FIG. 6A, a patterned mask 605 may be formed over the metal seed layer 115. The patterned mask 605 covers regions 603 to be converted, and leaves exposed the regions which are not to be converted. The patterned mask 605 includes an oxidizing material, such that the passage of time and/or the application of heat causes the regions covered by the patterned mask to be converted (e.g., oxidized). An embodiment using an oxidizing paste may require additional processing operations to remove an unintentionally formed oxide layer on the metal regions 117.

Figure 7A:
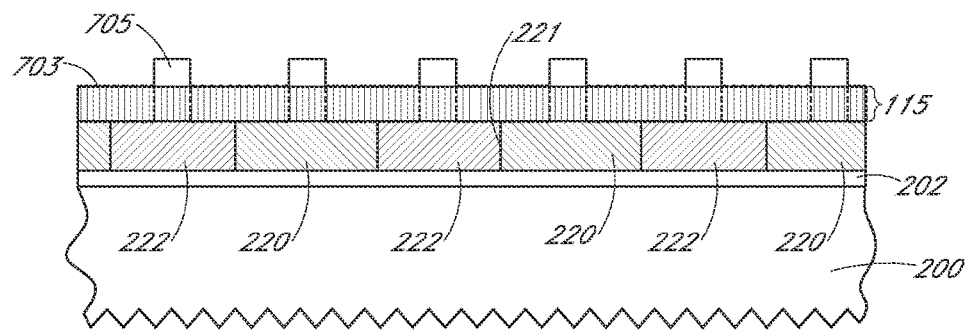
FIGS. 7A-7C illustrate cross-sectional views of processing operations in a method corresponding to operation 204 of the flowchart of FIG. 2A, in accordance with an embodiment of the present disclosure.
Figure 7B:
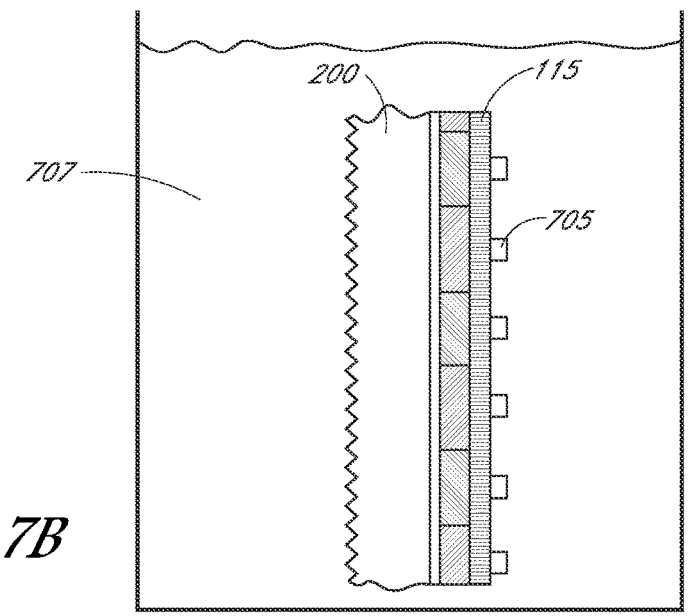
Figure 7C:
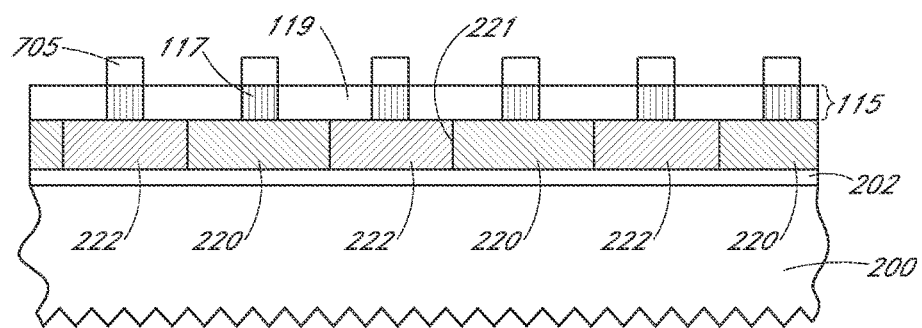

FIGS. 7A-7C illustrate a method of converting regions of the seed layer with a protective mask and an oxidizing solution, in accordance with an embodiment. As illustrated in FIG. 7A, a patterned mask 705 is formed over the metal seed layer 115. The patterned mask leaves the regions 703 of the metal seed layer 115 to be converted uncovered. The uncovered regions of the metal seed layer 115 are then exposed to an oxidizing solution (e.g., by submersion in the solution 707 as illustrated in FIG. 7B, or by other methods of exposure to an oxidizing solution). The oxidizing solution 707 may be heated (e.g., boiled) while exposing the uncovered regions of the metal seed layer to the solution. The oxidizing solution 707 oxidizes the uncovered regions to form the converted regions 119.

Figure 8A:
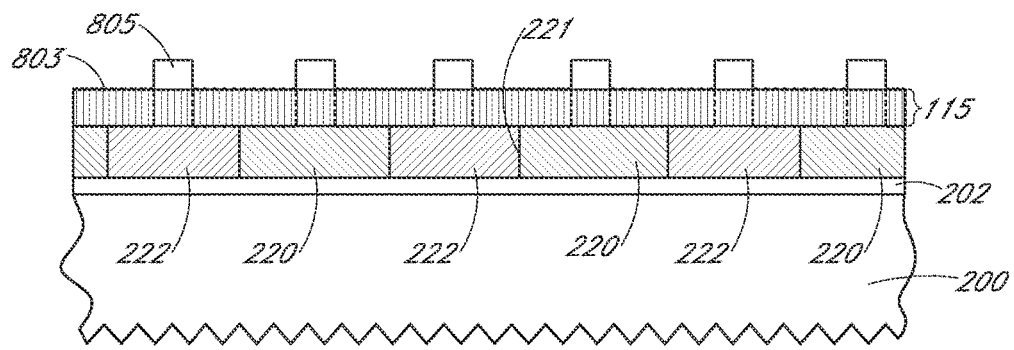
FIGS. 8A-8C illustrate cross-sectional views of processing operations in a method corresponding to operation 204 of the flowchart of FIG. 2A, in accordance with an embodiment of the present disclosure.
Figure 8B:
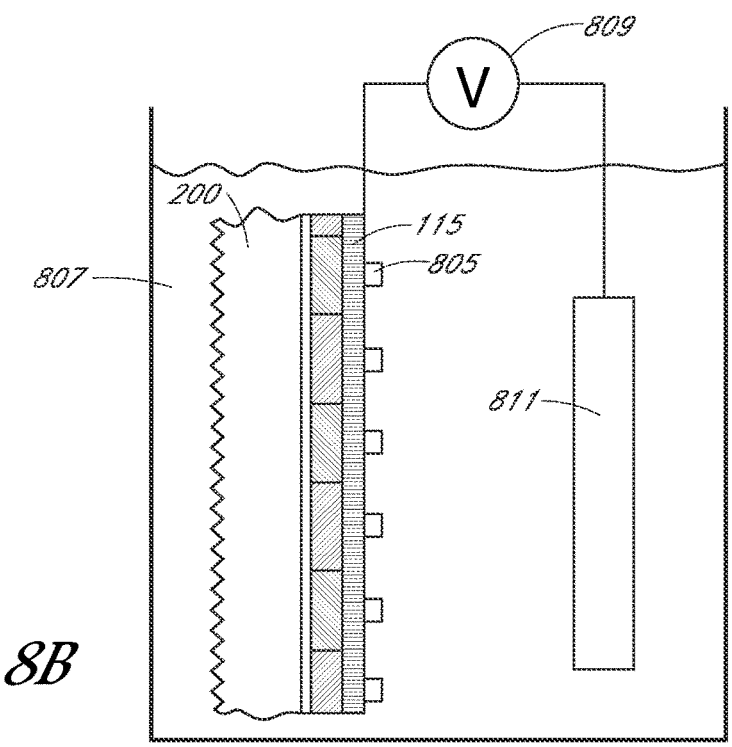
Figure 8C:
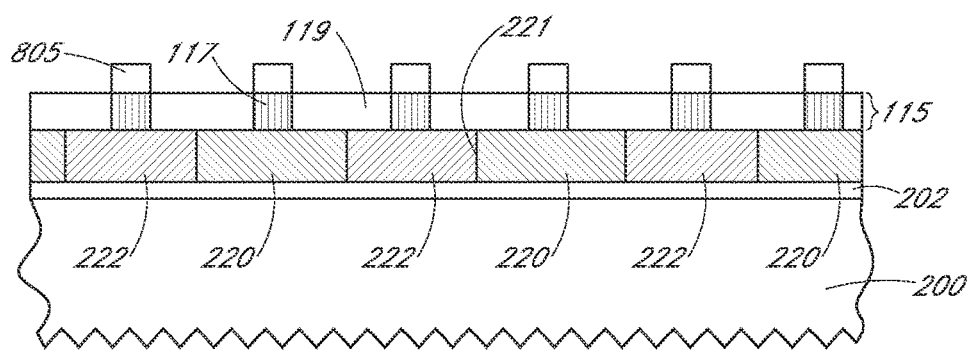

Thus, the method illustrated in FIGS. 7A-7C is an example of a chemical oxidation process. The method illustrated in FIGS. 8A-8C is an example of an electrochemical process. Specifically, FIGS. 8A-8C illustrate a method of converting regions of the seed layer with a local anodization method, in accordance with an embodiment. Similar to FIGS. 7A-7C, the method illustrated in FIGS. 8A-8C involves forming a patterned mask 805 over the metal seed layer 115. The patterned mask 805 leaves the regions 803 of the metal seed layer 115 to be converted uncovered. The anodization method illustrated in FIGS. 8A-8C further involves contacting the masked metal seed layer 115 to a DC power supply 809. The DC power supply 809 applies a voltage to the masked metal seed layer 115 (e.g., a voltage of 10 to 20 V relative to a counter electrode 811). In an example where the masked metal seed layer 115 is raised to a potential of 10 to 20 V, current density in the masked metal seed layer 115 reaches approximately 1 to 4 $A/dm^2$. Also similar to FIGS. 7A-7C the anodization method involves exposing the uncovered regions of the metal seed layer 115 to an oxidizing solution 807, such as by dipping or otherwise submerging the metal seed layer 115 in the oxidizing solution 807. The oxidizing solution 807 may include, for example, one or more of $H_2SO_4$, $H_2O_2$, phosphoric acid, and oxalic acid. The counter electrode 811 may be, for example, an aluminum plate facing the masked metal seed layer 115, and is also submerged in the oxidizing solution 807. When the metal seed layer 115 is anodized, a metal oxide is formed in the regions exposed to the oxidizing solution 807. The metal oxide formed by the anodization process may be referred to as "anodic aluminum oxide (AAO)," and typically has a porous structure. As described in more detail below, the porous metal oxide may be dyed to change the properties of the metal oxide regions. For example, the porous metal oxide regions may be dyed a color that increases the absorption or reflection of laser radiation.

Thus, FIGS. 4A, 4B, 5A-5C, 6A, 6B, 7A-7C, and 8A-8C illustrate exemplary methods of converting regions of the seed layer, in accordance with embodiments. Some of the methods described above to convert the metal seed layer may be combined. For example, in one embodiment, an oxidizing paste such as the paste described with reference to FIGS. 6A and 6B may be used in combination with a laser. Other embodiments may employ other methods of converting regions of the metal seed layer.

Figure 3C:
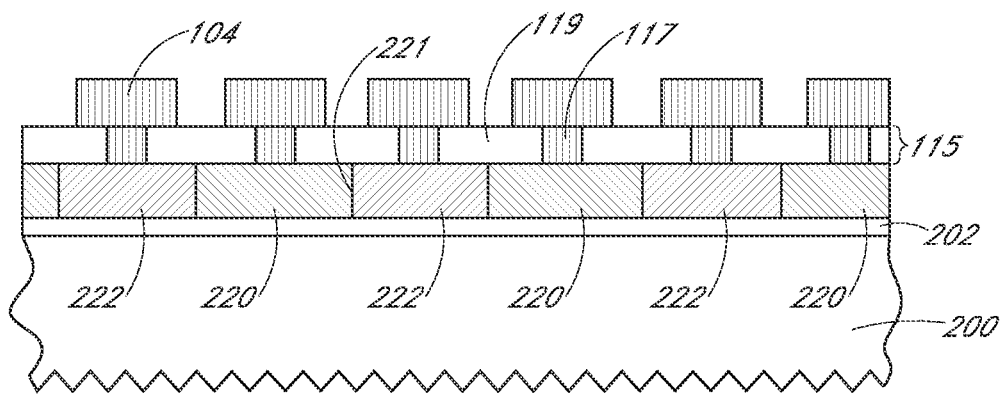

Returning to FIG. 2A and to corresponding FIG. 3C, the method also involves forming conductive contacts for the solar cell from unconverted regions of the metal seed layer, at operation 206. Formation of the conductive contacts may be by any method, such as plating (e.g., electroplating) or by placing, welding, and patterning a metal sheet. FIGS. 2B and 2C illustrate methods of fabricating solar cells, including two different exemplary methods for forming conductive contacts.

Figure 9A:
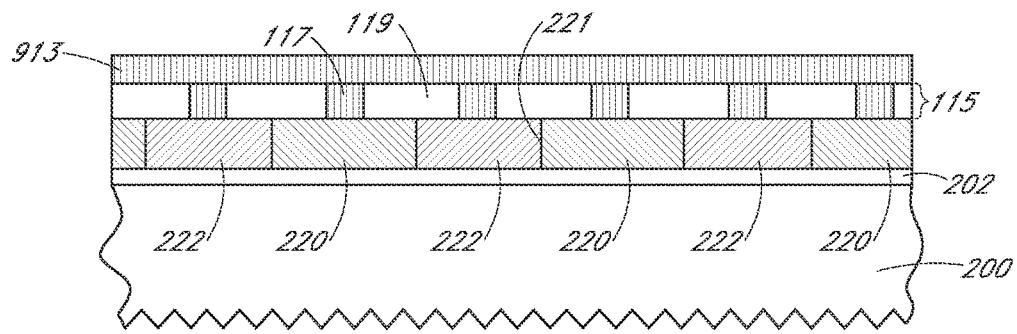
FIGS. 9A-9C and 10 illustrate cross-sectional views of processing operations in a method corresponding to operation 206 of the flowchart of FIG. 2A, in accordance with an embodiment of the present disclosure.
Figure 9B:
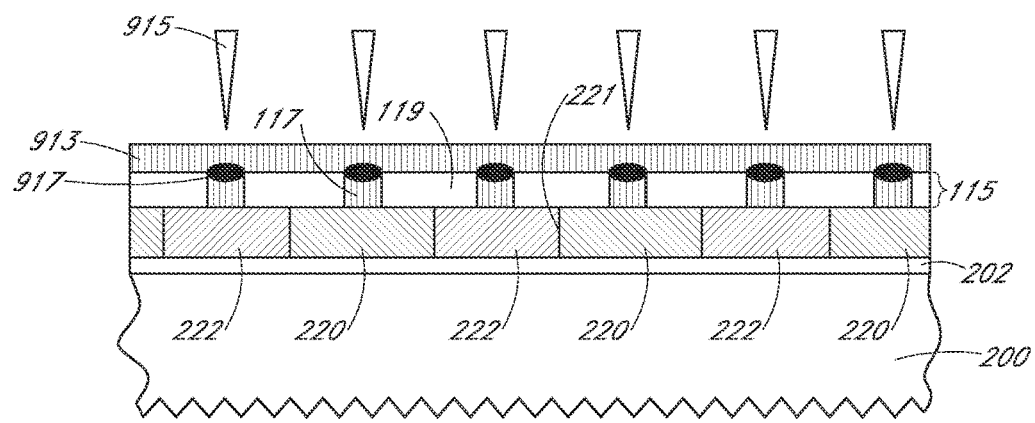
Figure 9C:
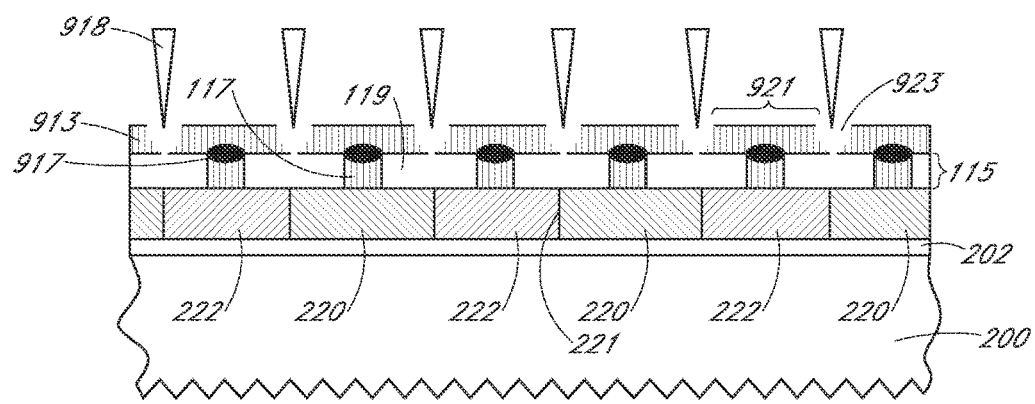

Turning to FIG. 2B and to corresponding FIGS. 9A-9C, after converting regions of the metal seed layer to a metal oxide, the method 200B continues at operation 207 with formation of a second metal layer over the metal seed layer, such as by placement of an aluminum sheet 913 over the seed layer 115. In an embodiment involving placement of an aluminum sheet 913 over the substrate, the method further involves bonding the aluminum sheet to the metal seed layer at operation 209, as illustrated in FIG. 9B. In the illustrated embodiment, bonding of the aluminum sheet is achieved by welding with a laser 915. Laser welding is typically not a continuous weld, but instead involves welding the metal layers at a series of dots 917. In one such embodiment, the series of dots 917 are located at the unconverted metal regions 117. Other embodiments may involve other methods of forming a second metal layer over the seed layer 115.

The method 200B then involves patterning the aluminum sheet 913 to isolate the individual conductive contacts 921 at operation 211, as illustrated in FIG. 9C. Patterning the aluminum sheet 913 may involve, for example, patterning with a laser 918 or other means of patterning a metal layer. In one such embodiment, patterning the aluminum sheet with a laser forms grooves 923, which electrically isolate the conductive contacts 921 formed between the grooves 923.

Thus, as mentioned above, some methods of fabricating solar cells involve the use of laser processing. In such embodiments, the converted regions of the seed layer may act as a damage barrier to prevent damage to underlying layers from the laser. Therefore, according to embodiments, the seed layer has a thickness in a range sufficient to protect the solar cell from significant damage due to laser processing, but thin enough to enable conversion of the entire thickness to provide electrical isolation of surrounding metal regions. In one such embodiment, the thickness of the metal seed layer is in the range of 0.3 to 2 µm. The converted regions may further be modified to enhance their function as a damage buffer. For example, in one such embodiment, the converted regions are dyed with a dye or coated with a coating that absorbs or reflects radiation from the laser. In embodiments where the converted regions are dyed, the converted regions have a porous structure to enable absorption of the dye. Such porous converted regions may be formed by, for example, an anodization method such as the method described above with respect to FIGS. 8A-8C, or any other process capable of forming a porous metal oxide.

Other embodiments may not involve laser processing over the converted regions. For example, FIG. 2C and corresponding FIG. 10 illustrate a method of fabricating solar cells involving plating to form conductive contacts.

Figure 10:
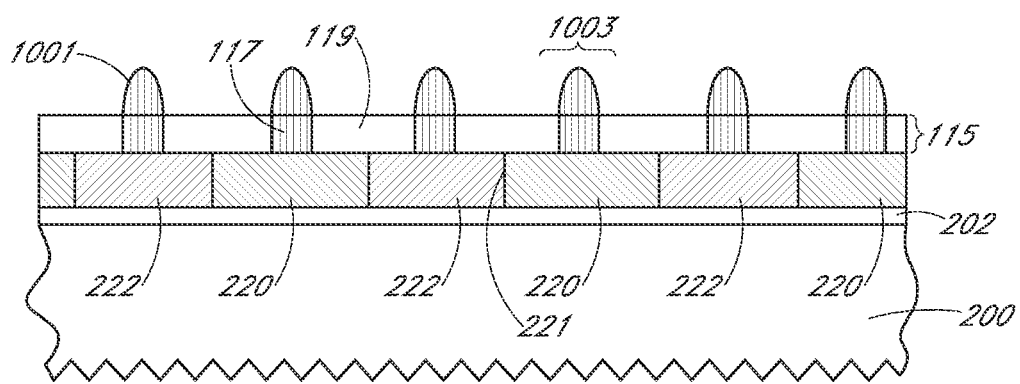

In the embodiment illustrated in FIG. 10, a metal (e.g., copper) 1001 is plated onto unconverted regions 117 of the metal seed layer 115, at operation 213. In embodiments involving plating, laser processing may not be used to form the conductive contacts 1003. Although the converted regions 119 may not serve as a damage buffer in methods without laser processing, such as the method 200C of FIG. 2C, the converted regions 119 may provide electrical insulation for the conductive contacts 1003.

Thus, solar cells with a converted seed layer as a buffer material have been disclosed. Embodiments provide a solar cell fabrication process that can simultaneously provide electrical insulation for conductive contacts and a localized damage buffer.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a metal seed layer over a substrate comprising p-n junctions;
    converting regions of the metal seed layer over the p-n junctions to a metal oxide, wherein the metal oxide has a porous structure; and
    forming conductive contacts for the solar cell from unconverted regions of the metal seed layer.

2. The method of claim 1, wherein forming the metal seed layer comprises forming an aluminum seed layer, and wherein converting the regions of the metal seed layer comprises converting the regions to aluminum oxide.

3. The method of claim 1, wherein forming conductive contacts for the solar cell further comprises:
    forming a second metal layer over the metal seed layer; and
    patterning the second metal layer over the converted metal oxide regions with a laser to form the conductive contacts.

4. The method of claim 3, wherein:
    forming the second metal layer comprises placing an aluminum sheet over the substrate and bonding the aluminum sheet to the metal seed layer.

5. The method of claim 4, wherein bonding the aluminum sheet to the metal seed layer comprises laser welding the aluminum sheet.

6. The method of claim 3, further comprising:
    applying a coating that absorbs or reflects radiation from the laser to the converted metal oxide regions.

7. The method of claim 1, wherein converting the regions of the metal seed layer over the p-n junctions to the metal oxide comprises:
    direct writing the regions with a laser in an atmosphere comprising oxygen.

8. The method of claim 1, wherein converting the regions of the metal seed layer over the p-n junctions to the metal oxide comprises:
    applying an oxidizing coating to the metal seed layer; and
    direct writing the oxidizing coating over the regions with a laser.

9. The method of claim 1, wherein converting the regions of the metal seed layer over the p-n junctions to the metal oxide comprises:
    forming a patterned mask over the metal seed layer, wherein the patterned mask comprises an oxidizing material, and wherein the patterned mask covers the regions of the metal seed layer to be converted; and
    heating the metal seed layer after forming the patterned mask over the metal seed layer.

10. The method of claim 1, wherein converting the regions of the metal seed layer over the p-n junctions to the metal oxide comprises:
    forming a patterned mask over the metal seed layer, the patterned mask leaving the regions of the metal seed layer to be converted uncovered; and
    exposing the uncovered regions of the metal seed layer to an oxidizing solution.

11. The method of claim 10, further comprising:
    heating the oxidizing solution while the exposing the uncovered regions of the metal seed layer.

12. The method of claim 10, further comprising:
    anodizing the uncovered regions of the metal seed layer.

13. The method of claim 12, further comprising:
    dying the converted metal oxide regions with a dye that absorbs or reflects radiation from the laser.

14. The method of claim 1, wherein:
    the substrate comprises a monocrystalline silicon substrate with p-type and n-type doped polycrystalline silicon regions disposed above the monocrystalline silicon substrate forming the p-n junctions; and
    the metal seed layer is disposed over the polycrystalline silicon regions.

15. The method of claim 1, wherein:
    the substrate comprises a monocrystalline silicon substrate comprising p-type and n-type doped regions forming the p-n junctions; and
    the metal seed layer is disposed over the doped regions of the monocrystalline silicon substrate.

16. A method of fabricating a solar cell, the method comprising:
    forming an aluminum seed layer over a substrate comprising p-n junctions, the substrate comprising a monocrystalline silicon substrate with p-type and n-type doped polycrystalline silicon regions disposed above the monocrystalline silicon substrate forming the p-n junctions;

converting regions of the aluminum seed layer over the p-n junctions to an aluminum oxide, wherein the aluminum oxide has a porous structure; and forming conductive contacts for the solar cell from unconverted regions of the aluminum seed layer.

17. The method of claim 16, wherein forming conductive contacts for the solar cell further comprises:

forming a second metal layer over the aluminum seed layer; and patterning the second metal layer over the converted aluminum oxide regions with a laser to form the conductive contacts.

18. The method of claim 17, wherein:

forming the second metal layer comprises placing an aluminum sheet over the substrate and bonding the aluminum sheet to the aluminum seed layer.

19. The method of claim 18, wherein bonding the aluminum sheet to the aluminum seed layer comprises laser welding the aluminum sheet.

20. The method of claim 17, further comprising:

applying a coating that absorbs or reflects radiation from the laser to the converted aluminum oxide regions.

* * * * *